(12) United States Patent
Miyake

(10) Patent No.: US 8,570,266 B2
(45) Date of Patent: Oct. 29, 2013

(54) DISPLAY DEVICE AND ELECTRONIC APPARATUS USING THE SAME

(75) Inventor: Hiroyuki Miyake, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1097 days.

(21) Appl. No.: 11/719,785

(22) PCT Filed: Dec. 5, 2005

(86) PCT No.: PCT/JP2005/022707
§ 371 (c)(1),
(2), (4) Date: May 21, 2007

(87) PCT Pub. No.: WO2006/062212
PCT Pub. Date: Jun. 15, 2006

(65) Prior Publication Data
US 2009/0146920 A1    Jun. 11, 2009

(30) Foreign Application Priority Data

Dec. 6, 2004 (JP) .................................. 2004-353445

(51) Int. Cl.
*G09G 3/36* (2006.01)

(52) U.S. Cl.
USPC ................................ 345/98; 345/99; 345/100

(58) Field of Classification Search
USPC ............... 345/55, 87, 76, 77, 82, 83, 98–100
See application file for complete search history.

(56) References Cited

U.S. PATENT DOCUMENTS

| 5,790,089 | A | 8/1998 | Ono et al. |
| 6,583,775 | B1 * | 6/2003 | Sekiya et al. .................. 345/76 |
| 6,611,107 | B2 | 8/2003 | Mikami et al. |
| 6,724,377 | B2 | 4/2004 | Ouchi et al. |
| 6,819,311 | B2 | 11/2004 | Nose et al. |
| 6,885,385 | B2 | 4/2005 | Ouchi et al. |
| 7,053,874 | B2 | 5/2006 | Koyama |
| 7,129,918 | B2 | 10/2006 | Kimura |
| 7,145,545 | B2 * | 12/2006 | Zebedee et al. ............... 345/100 |
| 7,205,965 | B2 | 4/2007 | Mikami et al. |
| 7,262,757 | B2 | 8/2007 | Morita et al. |

(Continued)

FOREIGN PATENT DOCUMENTS

| EP | 1 061 497 | 12/2000 |
| EP | 1 406 242 A2 | 4/2004 |

(Continued)

OTHER PUBLICATIONS

PCT International Search Report (Application No. PCT/JP2005/022707) dated Feb. 14, 2006 (3 pages).

(Continued)

*Primary Examiner* — Kevin M Nguyen
(74) *Attorney, Agent, or Firm* — Fish & Richardson P.C.

(57) ABSTRACT

A display device with reduced power consumption, high definition, and a slim bezel. Both of a writing operation and an erasing operation are performed by one gate driver that is mainly constituted by a shift register for selecting a row and a control circuit for switching between a writing operation and an erasing operation. The switching of the control circuit is performed using an output signal of the shift register of the row, an output signal of the control circuit of the previous row, and an externally inputted signal.

11 Claims, 9 Drawing Sheets

(56) References Cited

U.S. PATENT DOCUMENTS

| | | |
|---|---|---|
| 7,265,742 B2 | 9/2007 | Iisaka |
| 7,474,282 B2 | 1/2009 | Okamoto |
| 7,800,604 B2 | 9/2010 | Iisaka |
| 2002/0033783 A1* | 3/2002 | Koyama ........................ 345/82 |
| 2002/0093468 A1 | 7/2002 | Ouchi et al. |
| 2002/0140712 A1 | 10/2002 | Ouchi et al. |
| 2004/0104881 A1 | 6/2004 | Furuya |
| 2004/0150610 A1 | 8/2004 | Zebedee et al. |
| 2004/0179807 A1 | 9/2004 | Tanaka |
| 2004/0189572 A1 | 9/2004 | Nose |
| 2005/0134536 A1* | 6/2005 | Lo ................................. 345/76 |
| 2005/0169330 A1 | 8/2005 | Hongo et al. |
| 2006/0202924 A1 | 9/2006 | Koyama |
| 2007/0296670 A1 | 12/2007 | Morita et al. |

FOREIGN PATENT DOCUMENTS

| | | |
|---|---|---|
| EP | 1 445 775 A1 | 8/2004 |
| JP | 04-309995 A | 11/1992 |
| JP | 2001-060076 | 3/2001 |
| JP | 2001-166280 A | 6/2001 |
| JP | 2001-324958 | 11/2001 |
| JP | 2002-175041 | 6/2002 |
| JP | 2002-215092 | 7/2002 |
| JP | 2002-297094 | 10/2002 |
| JP | 2003-140619 | 5/2003 |
| JP | 2003-186438 A | 7/2003 |
| JP | 2003-255912 | 9/2003 |
| JP | 2003-321081 A | 11/2003 |
| JP | 2003-347237 A | 12/2003 |
| JP | 2004-063924 A | 2/2004 |
| JP | 2004-177930 A | 6/2004 |
| JP | 2004-294672 | 10/2004 |
| JP | 2004-294733 | 10/2004 |
| JP | 2004-334105 A | 11/2004 |
| JP | 2004-341299 A | 12/2004 |
| JP | 2004-342954 A | 12/2004 |
| JP | 2005-136218 A | 5/2005 |
| JP | 2005-173418 | 6/2005 |
| JP | 2005-217209 A | 8/2005 |
| KR | 2004-0068468 A | 7/2004 |

OTHER PUBLICATIONS

PCT Written Opinion (Application No. PCT/JP/2005/022707) dated Feb. 14, 2006 (4 pages).

Search Report (European Patent Application No. 05814448.6) dated Jan. 8, 2010.

Office Action, Korean Application No. 2007-7013920, dated Feb. 22, 2012, 14 pages with full English translation.

Office Action (Chinese Patent Application No. 200680050867.1) mailed Jan. 8, 2010 with full English translation.

* cited by examiner shift register 401
selector circuit 402
RS latch circuit 403
AND circuit 404
buffer circuit 405
inverter circuit 406
inverter circuit 407

DISPLAY DEVICE AND ELECTRONIC APPARATUS USING THE SAME

TECHNICAL FIELD

The present invention relates to a display device having a plurality of pixels arranged in matrix, and an electronic apparatus using the display device. More specifically, the invention relates to a display device where a video signal is inputted to a selected pixel to control each pixel and display images, and an electronic apparatus using the display device.

BACKGROUND ART

The demand for dot matrix display devices typified by liquid crystal display devices has been rapidly increasing for portable applications as well as fixed applications such as a TV receiver and a display for a personal computer. In recent years, as a next-generation display device replacing liquid crystal display devices, EL display devices that have pixels each including an organic electroluminescence (EL) element have been put into practical use.

A dot matrix display device is generally classified into a passive matrix display device and an active matrix display device. In the active matrix display device, a gray scale is displayed by an analog gray scale method or a digital gray scale method. The analog gray scale method is a method of displaying a gray scale by controlling the luminance of pixels. In the digital gray scale method, each pixel is controlled by two values: whether light is emitted or not. A gray scale is displayed by the size of a light emitting area or the length of a light emitting time in a certain period, and the former is called an area gray scale method while the latter is called a time gray scale method.

In the aforementioned time gray scale method, one frame period is divided into a plurality of subframe periods, and the light emitting time in each subframe period is set different. Then, the luminance in one frame period is controlled by combining the subframe periods to display a gray scale. One of the methods of achieving a multi-gray scale in this manner is disclosed in Patent Document 1.

According to Patent Document 1, in the case of, for example, a 6-bit display (64 gray scale levels), one frame period is divided into six subframe periods (SF1 to SF6), the length of a light emitting time in each subframe period is set $2^5:2^4:2^3:2^2:2^1:1$, and each gray scale level is displayed by selecting the subframe period where light is emitted (see FIG. 5A). Specifically, if light is emitted in none of the subframe periods, the first gray scale level (black: luminance 0) is displayed, and if light is emitted in all of the subframe periods, the 64th gray scale level (white: luminance 63) is displayed. Meanwhile, if the light emitting times having lengths of $2^4$, $2^3$, $2^2$, and 1 are selected, $2^4+2^3+2^2+1=29$, namely the 30th gray scale level (luminance 29) is displayed among the 64 gray scale levels from the luminance 0 to the luminance 63.

In a lower bit, namely in a subframe period having a short light emitting time, it is necessary to stop light emission before the next subframe period starts. Thus, one-row selection period is divided into a plurality of sub-horizontal periods (see FIG. 5B, where one-row selection period is divided into two sub-horizontal periods), and a video signal is written in one sub-horizontal period while a video signal is erased in another sub-horizontal period. The light emitting time of each bit is controlled by performing the writing operation and the erasing operation in an appropriate row at an appropriate timing. The writing operation and the erasing operation are performed by the corresponding gate drivers (also called gate signal line driver circuits).

[Patent Document 1] Japanese Patent Laid-Open No. 2001-324958

DISCLOSURE OF INVENTION

If a display device is driven by the digital time gray scale method disclosed in Patent Document 1, an active matrix pixel is driven by only two states: white display or black display. Accordingly, this method is advantageous in that display quality is not influenced so much by variations in characteristics of thin film transistors (hereinafter referred to as TFTs) constituting a pixel.

On the other hand, the method disclosed in Patent Document 1 is disadvantageous in that a video signal is written many times in one frame period, a writing operation, an erasing operation and the like are required for controlling the light emitting time, periphery driver circuits are operated at a high frequency, and power consumption is increased. In addition, since the writing operation and the erasing operation are performed by the corresponding gate drivers, two gate drivers are required. With increase in gray scale levels, each gate driver is generally required to be operated at a higher frequency and occupies a larger area. Accordingly, the rate of increase in the area of the two gate drivers in a panel is higher than that of a display device having one gate driver. Further, in general, a horizontal period is reduced and the load of a gate line is increased in a display device with higher definition; therefore, according to the method of inputting a signal from one side of a gate signal line, much higher definition cannot be achieved.

In view of the foregoing problems, the invention provides a display device that is driven by the digital time gray scale method at lower power consumption, as well as an electronic apparatus using the display device. The invention also provides a display device with high definition, as well as an electronic apparatus using the display device. Further, the invention provides a display device with a slim bezel, as well as an electronic apparatus using the display device.

According to the invention, both of a writing operation and an erasing operation are performed by one gate signal line driver circuit. In addition, two of the gate signal line driver circuits are used to achieve high definition. The writing operation herein means an operation of inputting a video signal to a selected row, and the erasing operation means an operation of inputting a non-display signal (e.g., a signal for displaying black in all pixels) to a selected row.

The gate signal line driver circuit of the invention is mainly constituted by a shift register for selecting a row and a control circuit for switching between a writing operation and an erasing operation of a video signal. The control circuit is, for example, an RS latch (a latch circuit having reset and set functions). The switching of the control circuit is performed using an output signal of the shift register corresponding to the selected row, an output signal of the control circuit corresponding to the previous row, and an externally inputted signal.

More specifically, the display device of the invention has gate signal lines arranged in a plurality of rows, source signal lines arranged in a plurality of columns, a pixel portion including a plurality of pixels formed in areas surrounded by the adjacent gate signal lines and the adjacent source signal lines, a source signal line driver circuit (also called a source driver) that is electrically connected to the source signal lines, and a gate signal line driver circuit that is electrically connected to the gate signal lines. The gate signal line driver circuit has a shift register for selecting the rows, and a control circuit for switching between a writing operation of a video signal to the pixels and an erasing operation of a video signal.

The switching operation is performed using an output signal of the control circuit corresponding to a row selected by the shift register and the previous row, and a signal externally inputted to the control circuit.

According to the invention, the gate signal line driver circuit is provided on opposite sides of the pixel portion, for example the right and left side thereof, so that the same signal is supplied to a selected row from opposite sides of the row.

The gate signal line driver circuit of the invention may be formed over the same substrate as the pixel portion. The source signal line driver circuit of the invention may also be formed over the same substrate as the pixel portion.

According to the invention having the aforementioned structures, the writing operation and the erasing operation can be performed by one gate signal line driver circuit, which results in reduced power consumption.

According to the invention having the aforementioned structures, only one gate signal line driver circuit is required; therefore, a display device with a slim bezel can be easily achieved.

According to the invention having the aforementioned structures, the gate signal line driver circuits are provided on opposite sides of the pixel portion and the same signal is supplied to a selected row from opposite sides of the row. Accordingly, a display device with high definition can be achieved even when a horizontal period is reduced and the load of a gate line is increased.

BEST MODE FOR CARRYING OUT THE INVENTION

Embodiment Mode 1

Figure 1A:
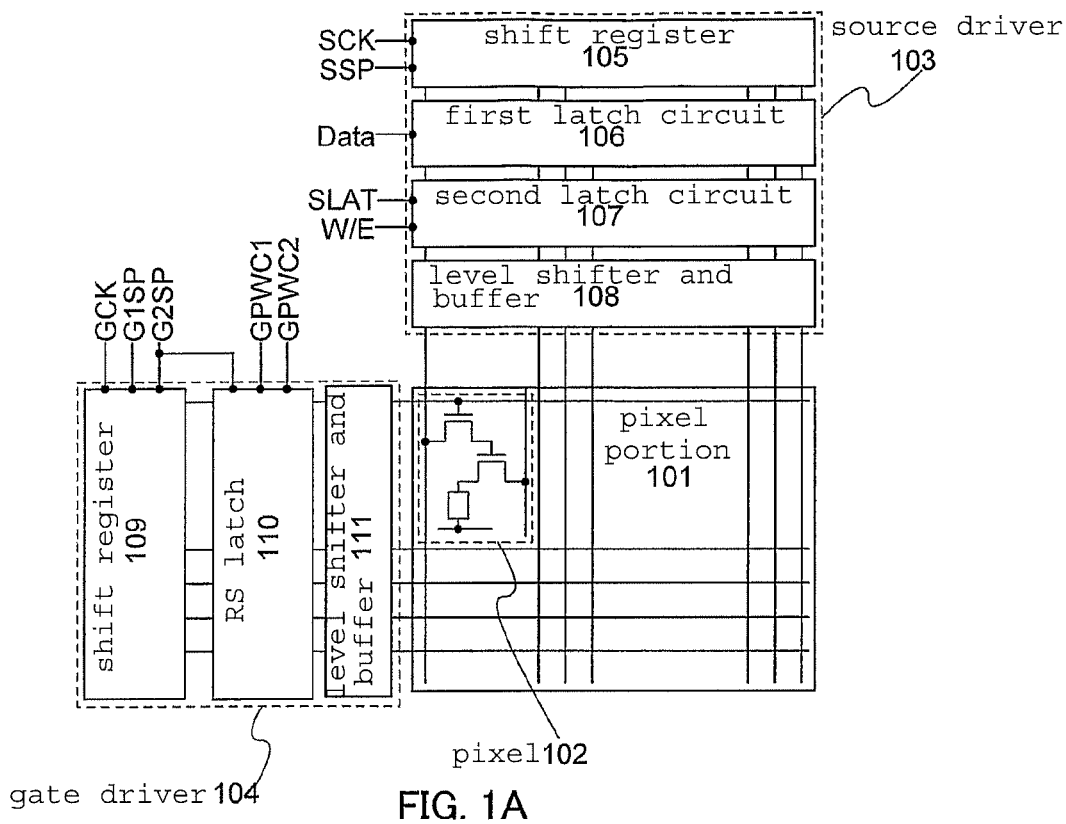
FIGS. 1A and 1B are diagrams illustrating the display device of the invention.

Although the invention will be described by way of Embodiment Modes and Embodiments, it is to be understood that various changes and modifications will be apparent to those skilled in the art. Therefore, unless such changes and modifications depart from the scope of the invention, they should be construed as being included therein. Described below is an example of using an RS latch as a control circuit.

A configuration of an active matrix display device of the invention is described with reference to FIG. 1A. In a pixel portion 101, a plurality of pixels 102 each surrounded by a dotted line frame are arranged in matrix. A source driver 103 and a gate driver 104 are provided at the periphery of the pixel portion 101.

The source driver 103 has a shift register 105, a first latch circuit 106, a second latch circuit 107, and level shifter and buffer 108. The gate driver 104 has a shift register 109, an RS latch 110, and level shifter and buffer 111.

The pixel 102 is specifically described with reference to FIG. 1B. Each pixel 102 has a source signal line 121 connected to the source driver 103, a gate signal line 122 connected to the gate driver 104, a current supply line 123, an opposite electrode 124, a switching TFT 125 connected to the source signal line 121 and the gate signal line 122, a driving TFT 126 connected to the current supply line 123, and a light emitting element 127 connected to the driving TFT 126 and the opposite electrode 124.

The pixel 102 is driven in different manners depending on the conductivity of the TFTs constituting the pixel, the direction of current flowing through the light emitting element, and the like. This embodiment mode shows an example where an N-channel TFT is used as the switching TFT 125, a P-channel TFT is used as the driving TFT 126, and current flows through the light emitting element 127 from the current supply line 123 with a higher potential to the opposite electrode 124 with a lower potential. In this specification, the logic of all circuits is described taking as an example the case where the pixel shown here is driven. However, it is needless to say that if the logic of signals and the relationship between power supplies are changed, the invention can also be applied to the case where a pixel having another configuration is driven. Thus, the conductivity and the like of the TFTs are not particularly limited.

In a row that is not selected, the gate signal line 122 is at Low level and the switching TFT 125 is turned off. Meanwhile, in a row where pixels are selected, the gate signal line 122 is at High level and the switching TFT 125 is turned on, so that the potential of the source signal line 121 is written to a gate electrode of the driving TFT 126.

If the source signal line 121 has a High potential at this time, the driving TFT 126 is turned off and no current flows through the light emitting element 127; therefore, the pixel displays black. On the other hand, if the source signal line 121 has a Low potential, the driving TFT 126 is turned on and current flows through the light emitting element 127; therefore, the pixel displays white. Note that although not shown in FIG. 1B, a video signal written to the gate electrode of the driving TFT 126 is preferably held in a storage capacitor or the like during a certain period. According to this, after the gate signal line 122 is changed into a non-selective state, the on state or the off state of the driving TFT 126, namely a black display or a white display can be maintained.

Next, an operation of the display device of the invention is described. More specifically, an operation of the display device of the invention, where both of a writing operation and an erasing operation are performed by one gate driver, is described.

In the source driver 103, the shift register 105 sequentially outputs sampling pulses from the first stage in accordance with a clock signal (SCK) and a start pulse (SSP). A video signal (Data) is sampled by the first latch circuit 106 in accordance with the sampling pulses outputted from the shift register 105. In a stage of the first latch circuit 106 after the sampling of video signals is completed, the inputted video signal is held in a memory portion of the first latch circuit 106 until the sampling is completed in the last stage. Then, after the sampling pulse is outputted from the last stage of the shift register 105 and the sampling is completed in all the stages of the first latch circuit 106, one-row data held in the first latch circuit 106 is simultaneously transferred to the second latch circuit 107 in accordance with a latch pulse (SLAT).

Subsequently, the amplitude is converted by the level shifter and buffer 108 as needed, and the source signal lines are charged/discharged in accordance with the video signals. A writing/erasing selection signal (hereinafter referred to as W/E signal) selects a mode of charging/discharging the source signal lines in accordance with the video signals, and a mode of outputting an erasing signal to all the source signal lines.

Meanwhile, in the gate driver 104, the shift register 109 sequentially outputs row selection pulses from the first stage in accordance with a clock signal (GCK), and a start pulse 1 (G1SP) or a start pulse 2 (G2SP). A pulse width control signal 1 (GPWC1) having a half period of the clock signal (GCK) and a pulse width control signal 2 (GPWC2) that is an inverted signal of the pulse width control signal 1 (GPWC1) are inputted to the gate driver 104.

Description is made on the case where the start pulse 1 (G1SP) is inputted and the case where the start pulse 2 (G2SP) is inputted.

As for the first stage of the RS latch 110, when the start pulse 1 (G1SP) is inputted to the shift register 109, the output of the RS latch does not change and an initial state is held. As the initial state is held, the RS latch selects the pulse width control signal 1 (GPWC1), and the logical AND between the pulse width control signal 1 (GPWC1) and the row selection pulse of the shift register 109 of the row is inputted to the level shifter and buffer 111 of the row. As a result, the level shifter and buffer 111 of the row outputs a writing signal to the gate signal line.

As for the second stage or later of the RS latch 110, in accordance with the output state (initial state) of the RS latch of several stages before, the logical AND between the pulse width control signal 1 (GPWC1) and the row selection pulse of the shift register 109 is inputted to the level shifter and buffer 111 of the row. As a result, the level shifter and buffer 111 of the row outputs a writing signal to the gate signal line.

Figure 6A:
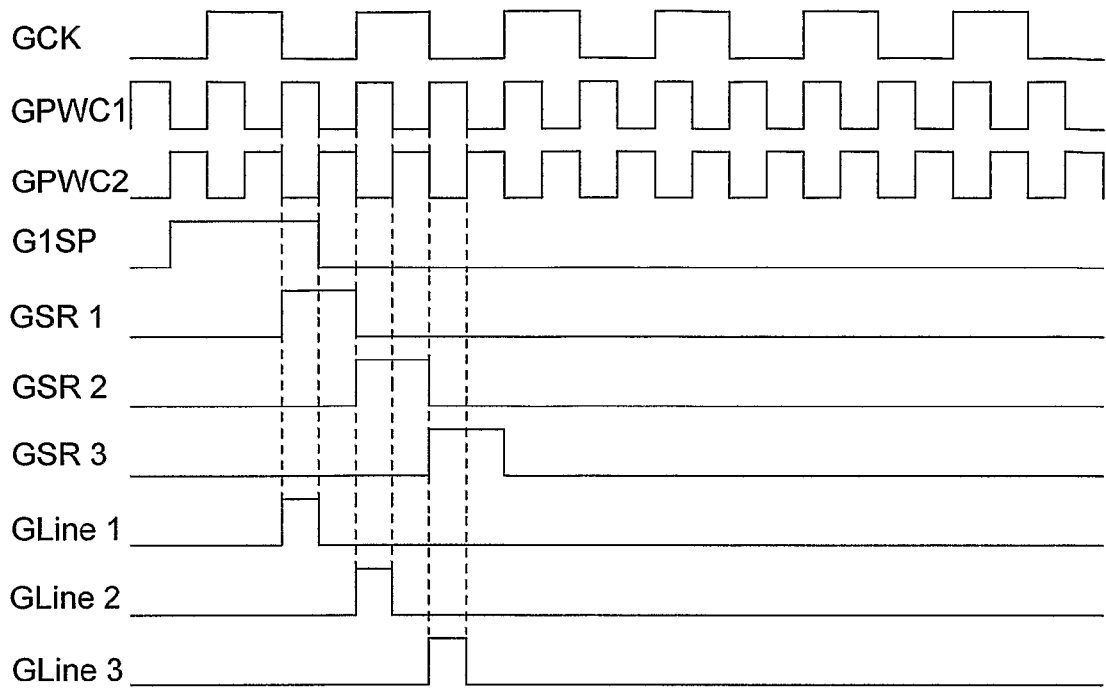
FIGS. 6A and 6B are timing charts illustrating the operation of the display device of the invention.

Such a series of operations is briefly shown in FIG. 6A. In FIG. 6A, GSR1, GSR2, and GSR3 are outputs of the shift register 109, and GLine1, GLine2, and GLine3 are gate signal lines and signals inputted thereto are shown.

When the start pulse 2 (G2SP) is inputted to the shift register 109, the output of the first stage of the RS latch 110 is inverted (set) to the initial state. The RS latch 110 selects the pulse width control signal 2 (GPWC2), and the logical AND between the pulse width control signal 2 (GPWC2) and the row selection pulse of the shift register 109 of the row is inputted to the level shifter and buffer 111 of the row. As a result, an erasing signal is outputted to the gate signal line.

As for the output of second stage or later of the RS latch 110, in accordance with the output that is inverted (set) to the initial state of the RS latch of the several stages before, the logical AND between the pulse width control signal 2 (GPWC2) and the row selection pulse of the shift register 109 is inputted to the level shifter and buffer 111 of the row, and an erasing signal is outputted to the gate signal line. The output of the previous RS latches is inputted to each RS latch. When the input is inverted (set) to the initial state, the output of the RS latch is reset and returned to the initial state.

Figure 6B:
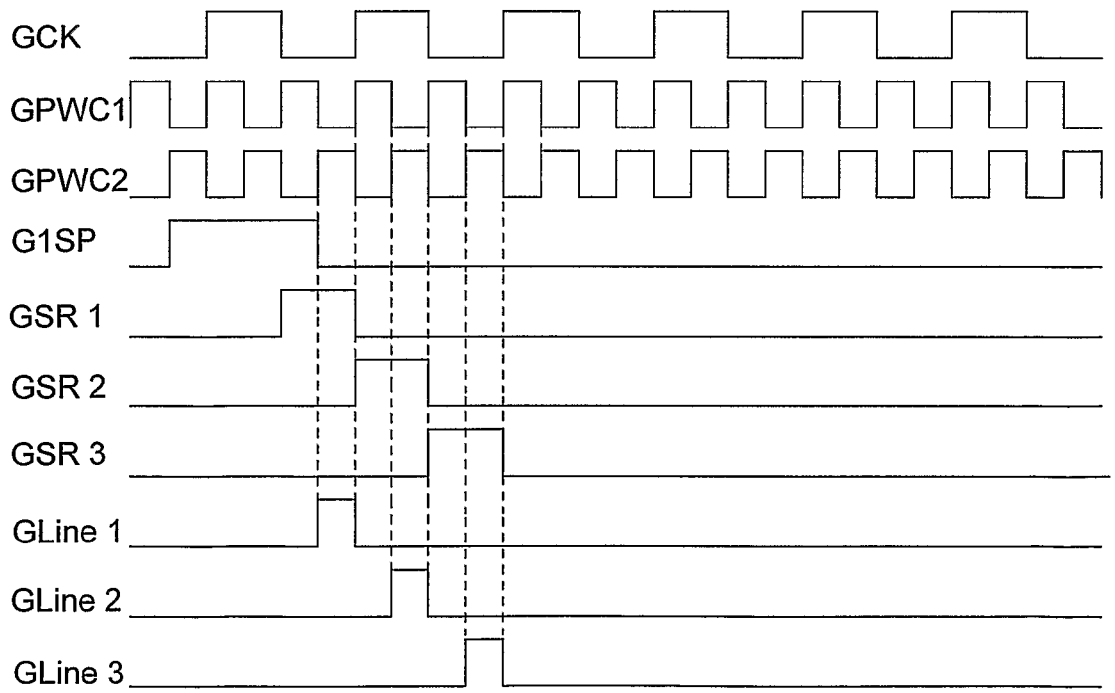

Such a series of operations is briefly shown in FIG. 6B. In FIG. 6B, GSR1, GSR2, and GSR3 are outputs of the shift register 109, and GLine1, GLine2, and GLine3 are gate signal lines and signals inputted thereto are shown.

As described above, in the gate driver 104 of the invention, the input of the start pulse 2 (G2SP) is delayed by an integer (integer of 2 or more) multiple of the clock signal (GCK) period from the input of the start pulse 1 (G1 SP). According to this, the writing operation and the erasing operation can be performed in one horizontal period. That is to say, the gate driver 104 of the invention can be considered to be one gate driver that has two functions of the writing gate driver and the erasing gate driver.

If the gate driver 104 of the invention is provided on only one side of the pixel portion 101, a smaller bezel can be achieved as compared to the case where the writing gate driver and the erasing gate driver are provided on opposite sides.

In addition, if the gate driver 104 of the invention is provided on only one side of the pixel portion 101, the number of shift registers 109 is reduced to half that in the case where the writing gate driver and the erasing gate driver are provided on opposite sides of the pixel portion. Thus, power consumption can be reduced.

Embodiment Mode 2

Figure 2:
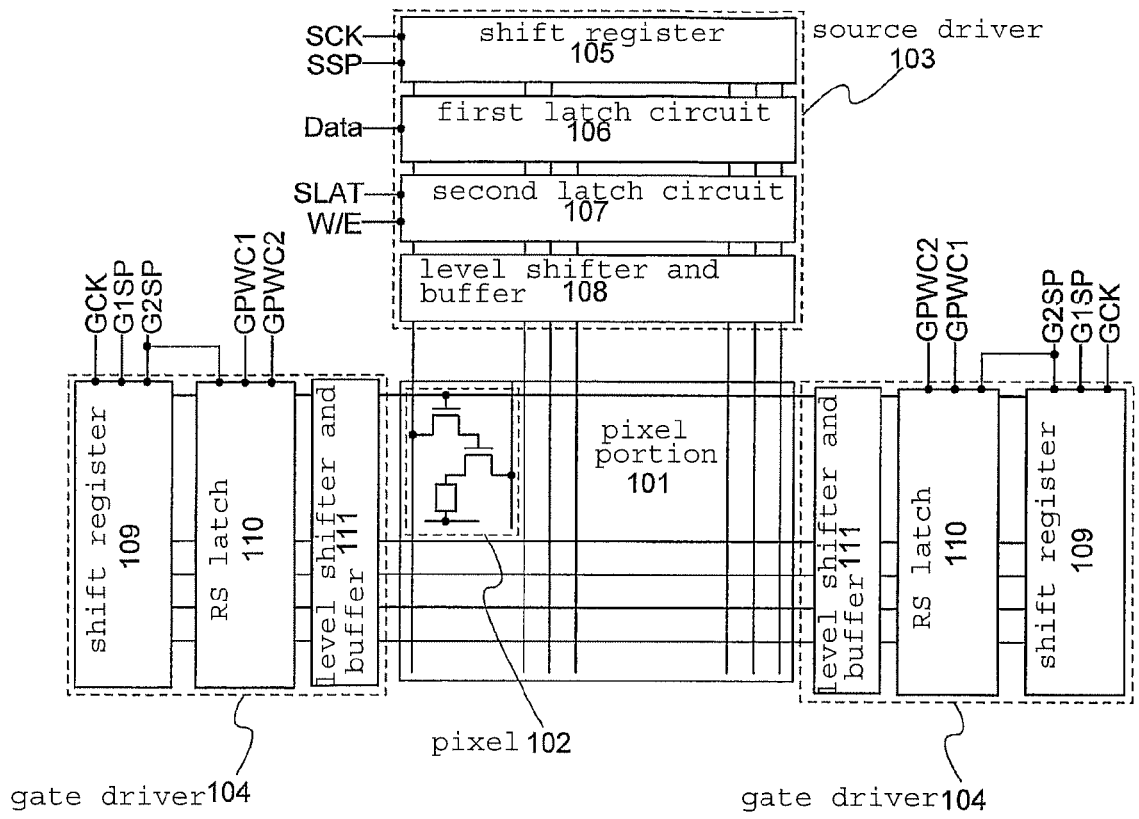
FIG. 2 is a diagram illustrating the display device of the invention.

As shown in FIG. 2, when the gate drivers 104 each having the shift register 109, the RS latch 110, and the level shifter and buffer 111 are provided on opposite sides of the pixel portion 101 and the same signal is outputted from the opposite sides to the same gate signal line at a time, the signal can be transmitted to the gate signal line faster. As a result, a display device with high definition can be achieved even when a horizontal period is reduced and the load of a gate line is increased.

In FIG. 2, the identical portions to those in FIG. 1A are denoted by the identical reference numerals. The gate driver in this embodiment mode has the same configuration as that shown in FIG. 1A. This embodiment mode is different from Embodiment Mode 1 in that the gate drivers 104 are provided on opposite sides of the pixel portion 101.

Embodiment Mode 3

Described in this embodiment mode is a configuration example of a driver circuit of the display device of the invention, namely a source driver and a gate driver.

Figure 3:
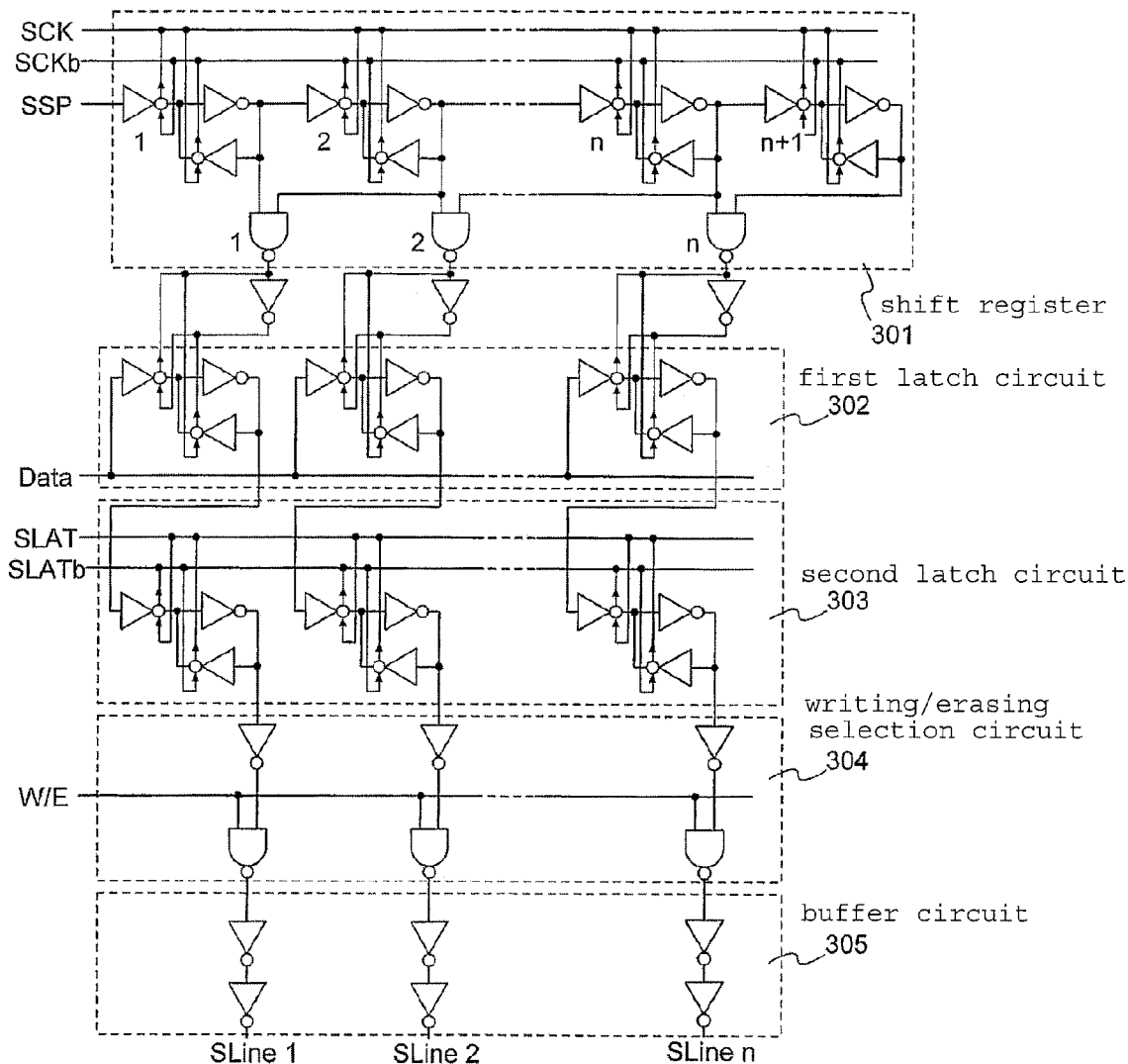
FIG. 3 is a diagram illustrating an example of a source driver used in the display device of the invention.

First, a configuration example of the source driver is described with reference to FIG. 3. The source driver has a shift register 301, a first latch circuit 302, a second latch circuit 303, a writing/erasing selection circuit 304, and a buffer circuit 305.

The shift register 301 sequentially outputs sampling pulses in accordance with clock signals (SCK, SCKb: inverted signal of SCK) and a start pulse (SSP). A video signal (Data) is sampled by the first latch circuit 302 in accordance with the sampling pulses outputted from the shift register 301. After the sampling of the video signal is completed in all the stages of the first latch circuit 302 and then latch pulses (SLAT, SLATb: inverted signal of SLAT) are inputted, the video signals held in the first latch circuit 302 are simultaneously transferred to the second latch circuit 303. The writing/erasing selection circuit 304 outputs an inverted signal of the video signal if a W/E signal is active (herein at High level). On the other hand, when the W/E signal is at Low level, the writing/erasing selection circuit 304 outputs a High level signal regardless of the video signal. Then, source signal lines (SLine 1 to SLine n) (n is an integer of 2 or more) are charged/discharged through the buffer circuit 305.

Figure 4:
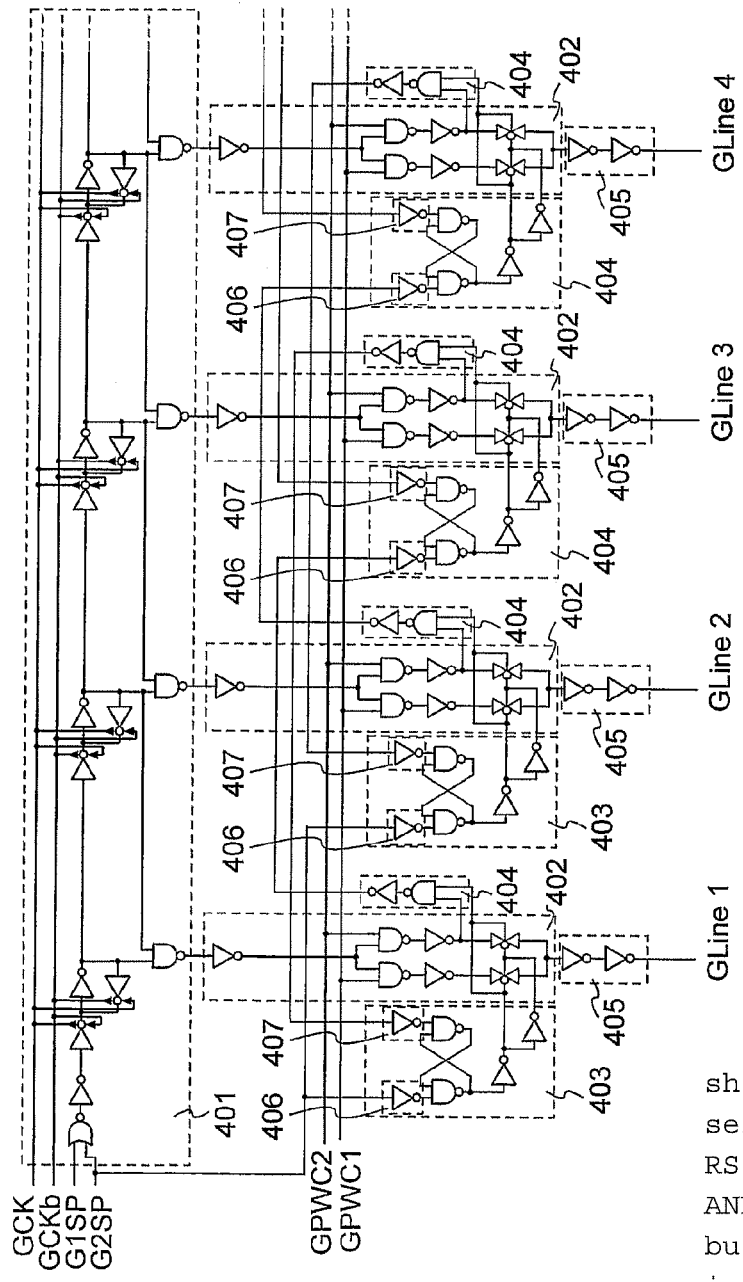
FIG. 4 is a diagram illustrating an example of a gate driver used in the display device of the invention.
Figure 5A:
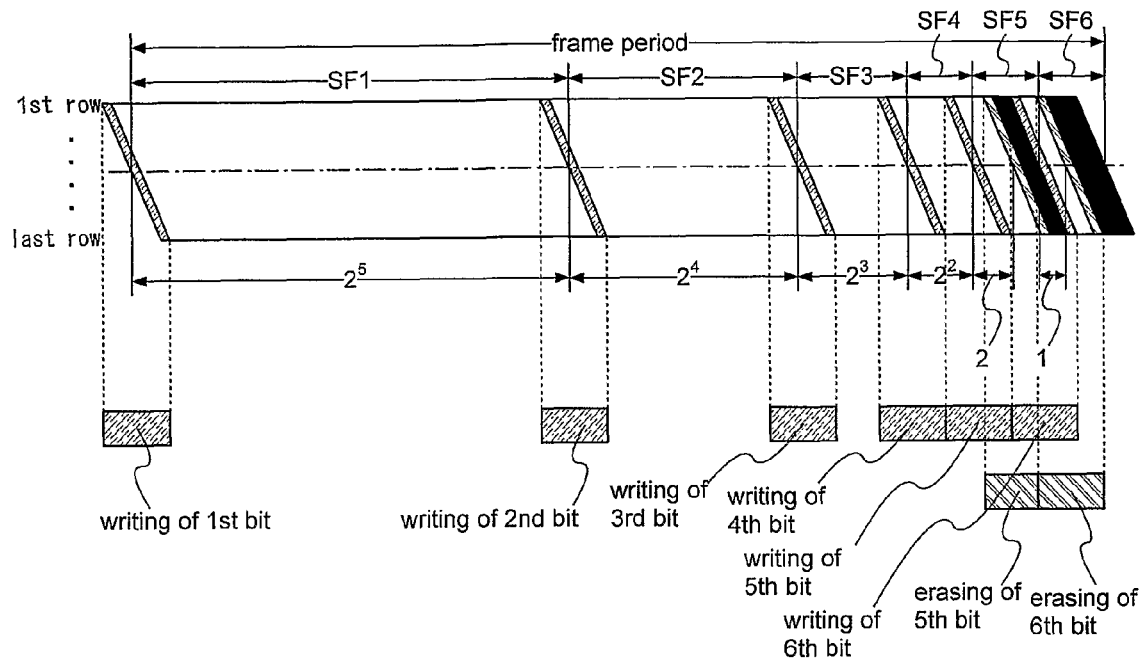
FIGS. 5A and 5B are diagrams illustrating the digital time gray scale method.
Figure 5B:
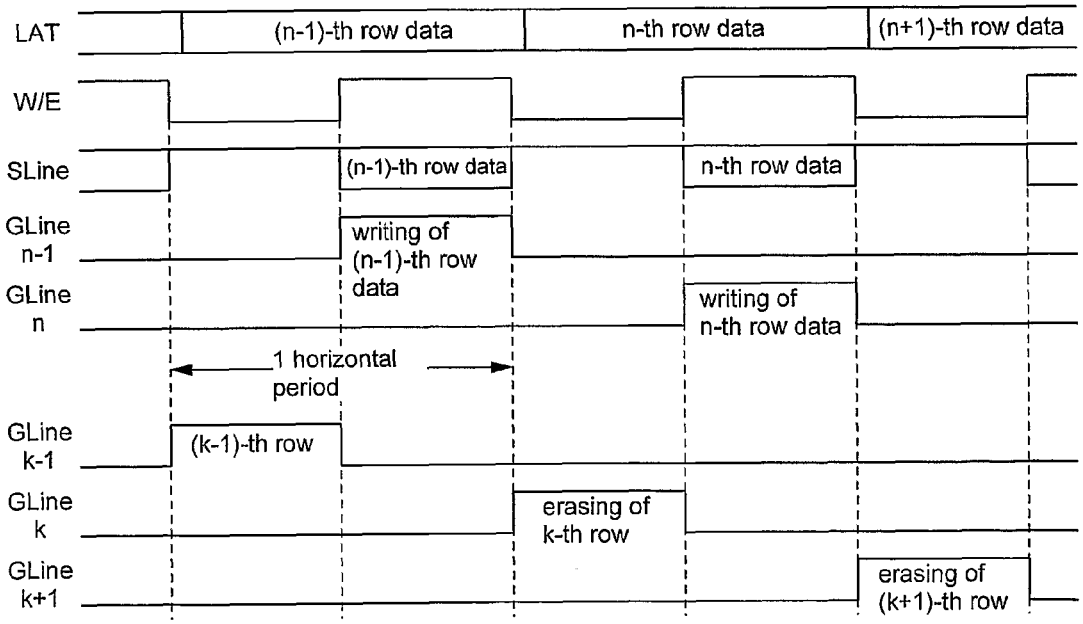

Next, a configuration of the gate driver is described with reference to FIG. 4. The gate driver has a shift register 401, a selector circuit 402, an RS latch circuit 403, an inverter circuit 406, an inverter circuit 407, an AND circuit 404, and a buffer circuit 405. An input of the inverter circuit 406 is connected to an output of the AND circuit 404 of two stages before, and an input of the inverter circuit 407 is connected to an output of the AND circuit 404 of two stages later. The input of the inverter circuit 406 is a set input of the RS latch circuit 403, and the input of the inverter circuit 407 is a reset input of the RS latch circuit 403. A start pulse 2 (G2SP) is connected to the inputs of the inverter circuits 406 of the first and second stages. When a start pulse 1 (G1SP) is inputted, the logical AND between a pulse width control signal 1 (GPWC1) and a row selection pulse of the shift register 401 is outputted to gate lines (GLine1, GLine2, GLine3, and GLine4). Meanwhile, when a start pulse 2 (G2SP) is inputted, the logical AND between a pulse width control signal 2 (GPWC2) and the row selection pulse of the shift register 401 is outputted to the gate lines (GLine1, GLine2, GLine3, and GLine4).

The selector circuit 402, the RS latch circuit 403, the inverter circuit 405, the inverter circuit 407, and the AND circuit 404 can be collectively referred to as a control circuit.

Although a level shifter is not provided in the gate driver and the source driver of this embodiment mode, it may be provided as needed.

Embodiment 1

Figure 7:
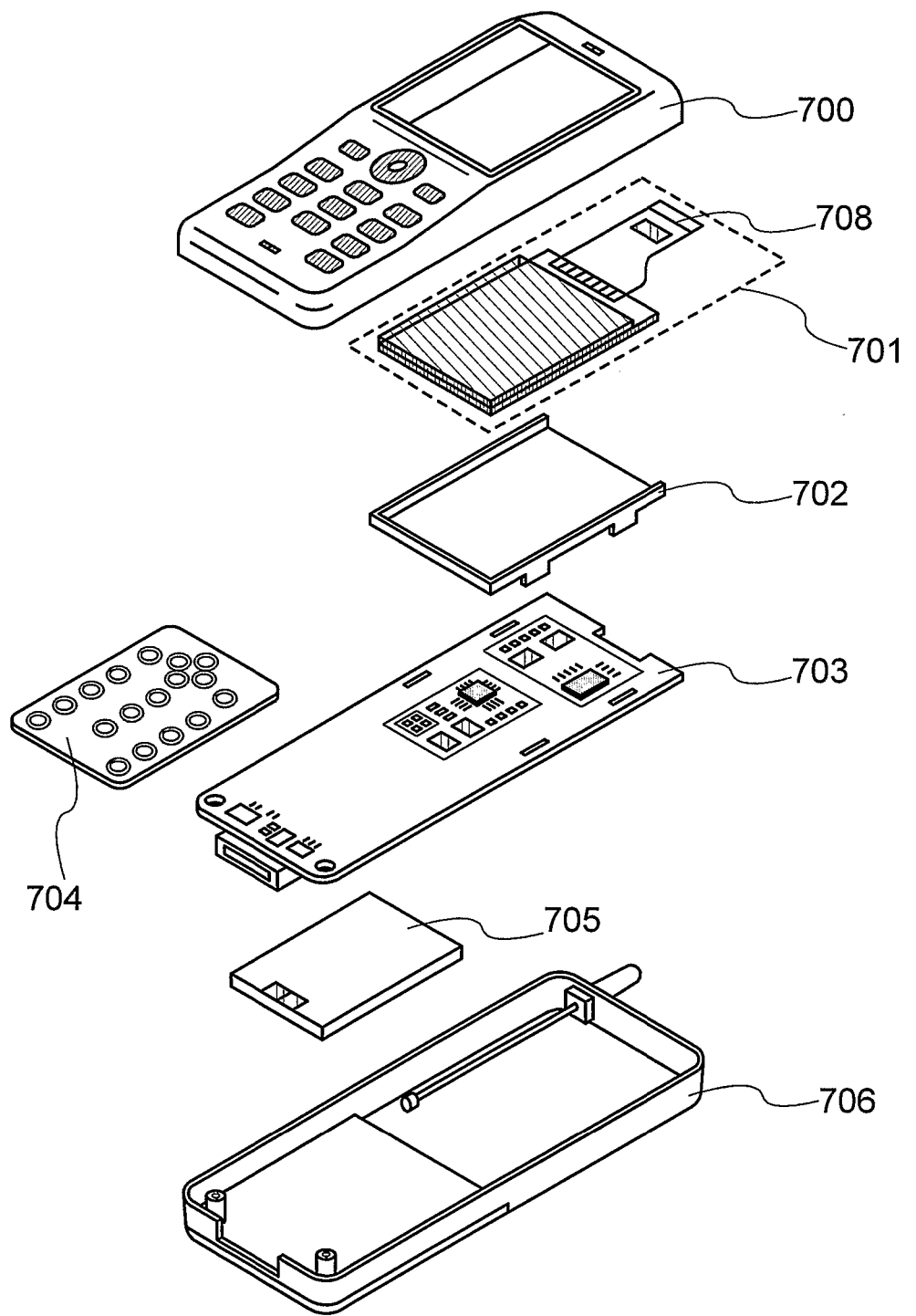
FIG. 7 is a diagram illustrating an example of a mobile phone.

FIG. 7 shows an example of a mobile phone that incorporates a display device using the gate driver and the source driver described in this specification, for example an electroluminescence (EL) display device.

Figure 1B:
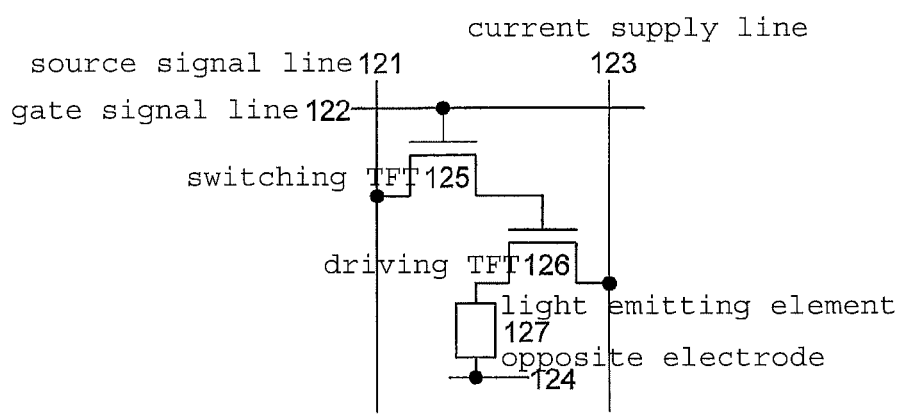

The configuration of the pixel of the electroluminescence (EL) display device is not limited to that described in Embodiment Mode 1 with reference to FIG. 1B. For example, one or both of the switching TFT and the driving TFT may adopt a so-called multi-gate structure where a plurality of TFTs are serially connected. In addition, the two kinds of TFTs of the switching TFT and the driving TFT are not necessarily employed. Further, the cross sectional structure and the conductivity (N-channel or P-channel) of each TFT are not particularly limited.

Layers constituting a light emitting element, insulating films, electrodes, and wires may be formed using any known material and method.

A display device 701 is incorporated in a housing 702 so as to be detachable. The shape and size of the housing 702 may be appropriately changed in accordance with the size of the display device 701. The housing incorporating the display device 701 is mounted onto a printed wiring board 703 to complete a module.

The display device 701 is connected to the printed wiring board 703 through an FPC 708. The printed wiring board 703 has a speaker, a microphone, a transmitting/receiving circuit, and a signal processing circuit including a CPU, a controller and the like. Such a module is combined with an input means 704 and a battery 705, and put in housings 700 and 706. A pixel portion of the display device 701 is disposed to be seen from a window formed in the housing 700.

By applying the invention to the display device incorporated in the mobile phone, reduced power consumption as well as longer life of the battery 705 can be achieved. In addition, a smaller bezel allows the window to occupy a larger area.

The mobile phone described in this embodiment can be used in various modes depending on the function and application thereof. The same effect can be achieved even when, for example, a plurality of display devices are provided, or the housing is divided into two or more parts so as to be opened and closed with a hinge.

Embodiment 2

Figure 8A:
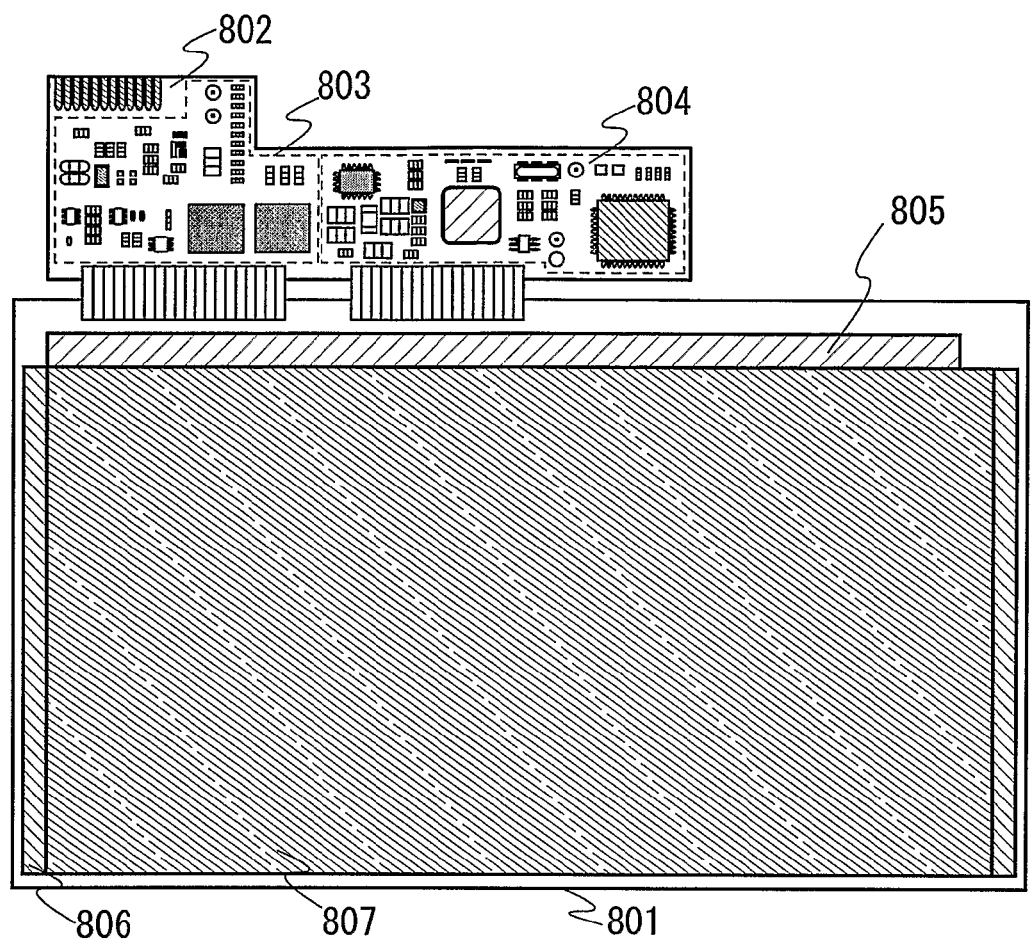
FIGS. 8A and 8B are diagrams illustrating an example of a television receiver.

FIG. 8A shows a display device having a display panel 801 and a circuit board 802, which is incorporated in a television receiver. The display device is, for example, an electroluminescence (EL) display device that uses the source driver and the gate driver described in this specification.

The configuration of the pixel of the electroluminescence (EL) display device is not limited to that described in Embodiment Mode 1 with reference to FIG. 1B. For example, one or both of the switching TFT and the driving TFT may adopt a so-called multi-gate structure where a plurality of TFTs are serially connected. In addition, the two kinds of TFTs of the switching TFT and the driving TFT are not necessarily employed. Further, the cross sectional structure and the conductivity (N-channel or P-channel) of each TFT are not particularly limited.

Layers constituting a light emitting element, insulating films, electrodes, and wires may be formed using any known material and method.

The circuit board 802 has, for example, a control circuit 803, a signal dividing circuit 804 and the like. Although a source driver 805 and a gate driver 806 are formed over the same substrate as a pixel portion 807 in FIG. 8A, only the gate driver 806 may be formed over the same substrate as the pixel portion 807. As described in Embodiment Mode 1, the gate driver 806 may be provided on only one side of the pixel portion 807.

Figure 8B:
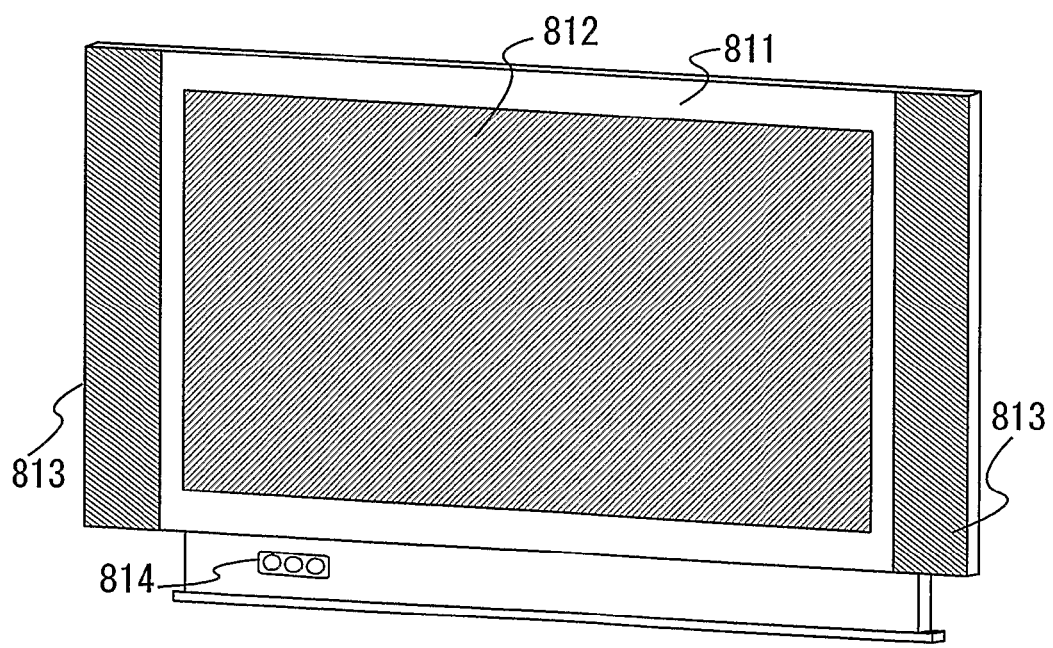

When the display device shown in FIG. 8A is incorporated in a housing 811, a television receiver as shown in FIG. 8B can be completed. Reference numeral 812 denotes a display screen, and speakers 813 and an operating switch 814 are appropriately provided.

By applying the invention to the display device incorporated in the television receiver, reduced power consumption as well as a smaller bezel can be achieved. The smaller bezel allows the display screen 812 to occupy a larger area.

Embodiment 3

Figure 9A:
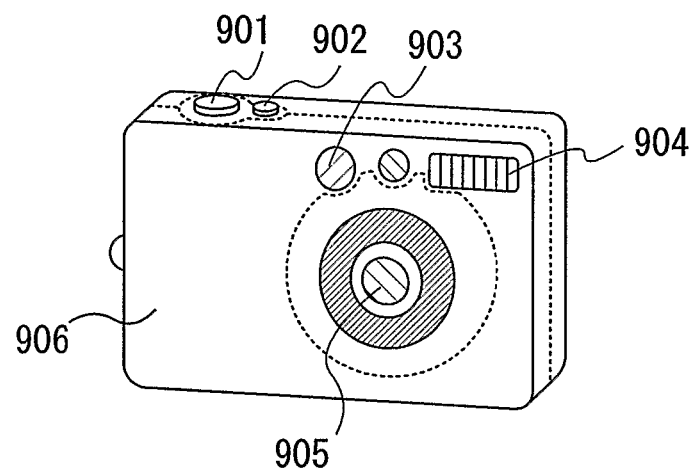
FIGS. 9A and 9B are diagrams illustrating an example of a digital camera.
Figure 9B:
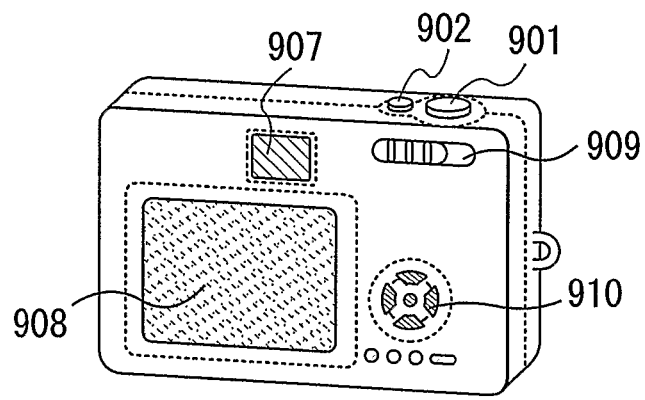

FIGS. 9A and 9B show an example of a digital camera that incorporates a display device using the gate driver and the source driver described in this specification, for example, an electroluminescence (EL) display device.

The configuration of the pixel of the electroluminescence (EL) display device is not limited to that described in Embodiment Mode 1 with reference to FIG. 1B. For example, one or both of the switching TFT and the driving TFT may adopt a so-called multi-gate structure where a plurality of TFTs are serially connected. In addition, the two kinds of TFTs of the switching TFT and the driving TFT are not necessarily employed. Further, the cross sectional structure and the conductivity (N-channel or P-channel) of each TFT are not particularly limited.

Layers constituting a light emitting element, insulating films, electrodes, and wires may be formed using any known material and method.

FIG. 9A is a front view of a digital camera. Reference numeral 901 denotes a release button, 902 denotes a main switch, 903 denotes a finder, 904 denotes an electronic flash, 905 denotes a lens, and 906 denotes a housing.

FIG. 9B is a back view of the digital camera shown in FIG. 9A. Reference numeral 907 denotes a finder eyepiece, 908 denotes a monitor, and 909 and 910 denote operating buttons.

By applying the invention to the display device incorporated in the monitor 908 of the digital camera, reduced power consumption as well as a smaller bezel can be achieved. The smaller bezel allows the monitor 908 to occupy a larger area.

The application of the invention is not limited to the mobile phone described in Embodiment 1, the television receiver described in Embodiment 2, and the digital camera described in Embodiment 3, and the invention can be applied to all electronic apparatuses incorporating the display device.

EXPLANATION OF REFERENCE

101: pixel portion 102: pixel 103: source driver 104: gate driver 105: shift register 106: first latch circuit 107: second latch circuit 108: level shifter and buffer 109: shift register 110: RS latch 111: level shifter and buffer 121: source signal line 122: gate signal line 123: current supply line 124: opposite electrode 125: switching TFT 126: driving TFT 127: light emitting element 301: shift register 302: first latch circuit 303: second latch circuit 304: writing/erasing selection circuit 305: buffer circuit 401: shift register 402: selector circuit 403: RS latch circuit 404: AND circuit 405: buffer circuit 406: inverter circuit 407: inverter circuit 700: housing 701: display device 702: housing 703: printed wiring board 704: input means 705: battery 706: housing 801: display panel 802: circuit board 803: control circuit 804: signal dividing circuit 805: source driver 806: gate driver 807: pixel portion 811: housing 812: display screen 813: speaker 814: operating switch 901: release button 902: main switch 903: finder 904: electronic flash 905: lens 906: housing 907: finder eyepiece 908: monitor 909: operating button 910: operating button

The invention claimed is:

1. A display device comprising:
gate signal lines arranged in a plurality of rows;
source signal lines arranged in a plurality of columns;
a pixel portion including a plurality of pixels, each of the pixels being surrounded by two adjacent ones of the gate signal lines and two adjacent ones of the source signal lines;
a source signal line driver circuit electrically connected to the source signal lines; and
a gate signal line driver circuit electrically connected to the gate signal lines,
wherein the gate signal line driver circuit includes a shift register and a latch circuit, the latch circuit comprising a plurality of stages,
wherein each stage of the latch circuit comprises an RS latch circuit,
wherein a given stage is configured to be inputted with a signal in accordance with an output of an RS latch circuit of a previous stage,
wherein a first stage of the shift register is configured to be inputted with a clock signal, a first start pulse signal and a second start pulse signal, and to output a row selection pulse in accordance with the first start pulse signal and the second start pulse signal,
wherein the latch circuit is configured to be inputted with the second start pulse signal, the row selection pulse, a first pulse width control signal, and a second pulse width control signal, and
wherein the gate signal line driver circuit is configured to output one of a writing signal and an erasing signal to the gate signal lines, in accordance with the second start pulse signal, the row selection pulse, the first pulse width control signal, and the second pulse width control signal.

2. A display device comprising:
gate signal lines arranged in a plurality of rows;
source signal lines arranged in a plurality of columns;
a pixel portion including a plurality of pixels, each of the pixels being surrounded by two adjacent ones of the gate signal lines and two adjacent ones of the source signal lines;
a source signal line driver circuit electrically connected to the source signal lines; and
a gate signal line driver circuit electrically connected to the gate signal lines and comprising an input configured to receive a signal for starting an erasing operation,
wherein the gate signal line driver circuit includes a shift register and a latch circuit comprising a plurality of stages, each stage comprising a control circuit for switching between outputting a writing signal, and outputting an erasing signal to one of the gate signal lines,
wherein the switching is performed using an output of a control circuit corresponding to a row selected by the shift register, an output of a control circuit corresponding to a previous row, and a signal externally inputted to the control circuit, and
wherein the shift register and the control circuit are each configured to be inputted with the signal for starting the erasing operation.

3. The display device according to claim 1 or 2, wherein the display device is applied to an electronic apparatus selected from a group consisting of a mobile phone, a digital camera and a television receiver.

4. The display device according to claim 1,
wherein each control circuit comprises a selector circuit, an RS latch circuit and an AND circuit,
wherein in each control circuit:
the selector circuit is configured to be inputted with outputs of the RS latch circuit, an output of the shift register, the first pulse width control signal and the second pulse width control signal, and
the AND circuit is inputted with outputs of the selector circuit, and
wherein an RS latch circuit of a first control circuit of a first stage of the latch circuit is inputted with an output of an AND circuit of a second control circuit of the previous stage.

5. The display device according to claim 1 or 2, wherein the gate signal line driver circuit is provided on opposite sides of the pixel portion.

6. The display device according to claim 5,
wherein each control circuit comprises a selector circuit, an RS latch circuit and an AND circuit,
wherein in each control circuit:
the selector circuit is configured to be inputted with outputs of the RS latch circuit, an output of the shift register, and
the AND circuit is configured to be inputted with outputs of the selector circuit, and
wherein an RS latch circuit of a first control circuit of a given stage of the latch circuit is inputted with an output of an AND circuit of a second control circuit of a previous stage.

7. A display device comprising:
a gate signal line;
a source signal line;
a pixel including a transistor, the transistor being electrically connected to the gate signal line and to the source signal line;

a source signal line driver circuit electrically connected to the source signal line; and a gate signal line driver circuit electrically connected to the gate signal line and comprising a shift register and a latch circuit;

wherein the shift register comprises a logic gate comprising a first input terminal and a second input terminal, the first input terminal and the second input terminal being configured to be inputted with a first signal input from outside of the gate signal line driver circuit and a second signal input from outside of the gate signal line driver circuit, respectively, and wherein the latch circuit comprises a circuit configured to perform a first logical AND operation between a signal outputted by the shift register and a third signal input from outside of the gate signal line driver circuit and a second logical AND operation between the signal transmitted by the output terminal of the shift register and a fourth signal input from outside of the gate signal line driver circuit.

8. The display device according to claim 7, wherein the gate signal line driver circuit is provided on opposite sides of a pixel portion including the pixel.

9. The display device according to claim 7, wherein the display device is applied to an electronic apparatus selected from a group consisting of a mobile phone, a digital camera and a television receiver.

10. The display device according to claim 7, wherein the first signal input from outside of the gate signal line driver circuit is a first start pulse signal, wherein the second signal input from outside of the gate signal line driver circuit is a second start pulse signal, wherein the third signal input from outside of the gate signal line driver circuit is a first pulse width control signal, and wherein the fourth signal input from outside of the gate signal line driver circuit is a second pulse width control signal.

11. The display device according to claim 7, wherein the latch circuit comprises stages each comprising an RS latch circuit, and wherein an RS latch circuit of a first stage is inputted with an output of a previous stage.

* * * * *

UNITED STATES PATENT AND TRADEMARK OFFICE
CERTIFICATE OF CORRECTION

PATENT NO.        : 8,570,266 B2
APPLICATION NO.   : 11/719785
DATED             : October 29, 2013
INVENTOR(S)       : Hiroyuki Miyake It is certified that error appears in the above-identified patent and that said Letters Patent is hereby corrected as shown below:

In the Claims

Column 10, line 18, in claim 2 after "signal" delete ",";

Column 10, line 49, in claim 6 replace "5" with --2--.

Signed and Sealed this
Eleventh Day of March, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,570,266 B2  
APPLICATION NO. : 11/719785  
DATED : October 29, 2013  
INVENTOR(S) : Hiroyuki Miyake Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1223 days.

Signed and Sealed this

Twenty-third Day of May, 2017

Michelle K. Lee
*Director of the United States Patent and Trademark Office*